(12) United States Patent
Cresse

(10) Patent No.: US 6,330,156 B1
(45) Date of Patent: Dec. 11, 2001

(54) CARD SUPPORT AND COOLER BRACKET

(75) Inventor: William M. Cresse, Meridian, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 09/676,431

(22) Filed: Sep. 29, 2000

Related U.S. Application Data

(63) Continuation of application No. 09/371,135, filed on Aug. 10, 1999, now abandoned.

(51) Int. Cl.[7] .................................................. H05K 7/20
(52) U.S. Cl. ........................ 361/695; 361/687; 361/724; 454/184; 165/122
(58) Field of Search .................................. 361/683, 687, 361/690–697, 724–727, 825, 829; 174/16.1, 16.3, 15.1; 165/80.3, 122, 126, 185; 454/184; 312/223.1, 223.2

(56) References Cited

U.S. PATENT DOCUMENTS

| | | |
|---|---|---|
| 4,728,160 | 3/1988 | Mondor et al. . |
| 4,977,532 | 12/1990 | Borkowicz et al. . |
| 5,051,868 | 9/1991 | Leverault et al. . |
| 5,062,016 | 10/1991 | Zupancic . |
| 5,101,321 | 3/1992 | Remise et al. . |
| 5,136,465 | 8/1992 | Benck et al. . |
| 5,269,598 | 12/1993 | Liu . |
| 5,309,983 | 5/1994 | Bailey . |
| 5,338,214 | 8/1994 | Steffes et al. . |
| 5,375,038 | 12/1994 | Hardt . |
| 5,432,674 | 7/1995 | Hardt . |
| 5,448,495 | 9/1995 | Liu . |
| 5,495,389 | 2/1996 | DeWitt et al. . |
| 5,514,036 | 5/1996 | Lin . |
| 5,547,272 | 8/1996 | Paterson et al. . |
| 5,562,410 | 10/1996 | Sachs et al. . |
| 5,576,931 | 11/1996 | Crane, Jr. et al. . |
| 5,586,865 | 12/1996 | Yin . |
| 5,680,295 | 10/1997 | Le et al. . |
| 5,717,570 | 2/1998 | Kikinis . |
| 5,761,034 | 6/1998 | Chu . |
| 5,784,251 | 7/1998 | Miller et al. . |
| 5,793,608 | 8/1998 | Winnick et al. . |
| 5,813,243 | 9/1998 | Johnson et al. . |
| 5,825,626 | 10/1998 | Hulick et al. . |
| 5,831,822 | 11/1998 | Hulick et al. . |
| 5,852,547 | 12/1998 | Kitlas et al. . |
| 5,860,291 | 1/1999 | Johnson et al. . |
| 6,034,870 | 3/2000 | Osborn et al. . |
| 6,086,476 | 7/2000 | Paquin et al. . |
| 6,215,659 | * 4/2001 | Chen ..................................... 361/695 |
| 6,244,953 | * 6/2001 | Dugan et al. ......................... 454/184 |

OTHER PUBLICATIONS

U.S. application No. 09/422,144, Johnson et al., filed Oct. 20, 1999.

* cited by examiner

*Primary Examiner*—Leo P. Picard
*Assistant Examiner*—Michael Datskovsky
(74) *Attorney, Agent, or Firm*—Perkins Coie LLP

(57) ABSTRACT

A bracket is provided for mounting daughter cards to a computer motherboard. The bracket is connectable to the chassis of the computer and has support slots that cooperate with connectors on the motherboard to secure the daughter cards. The bracket supports a fan for cooling the daughter cards. The fan gathers the cooling air from a plenum incorporated in the bracket. A grill incorporated in the bracket directs the cooling air over the daughter cards.

45 Claims, 2 Drawing Sheets

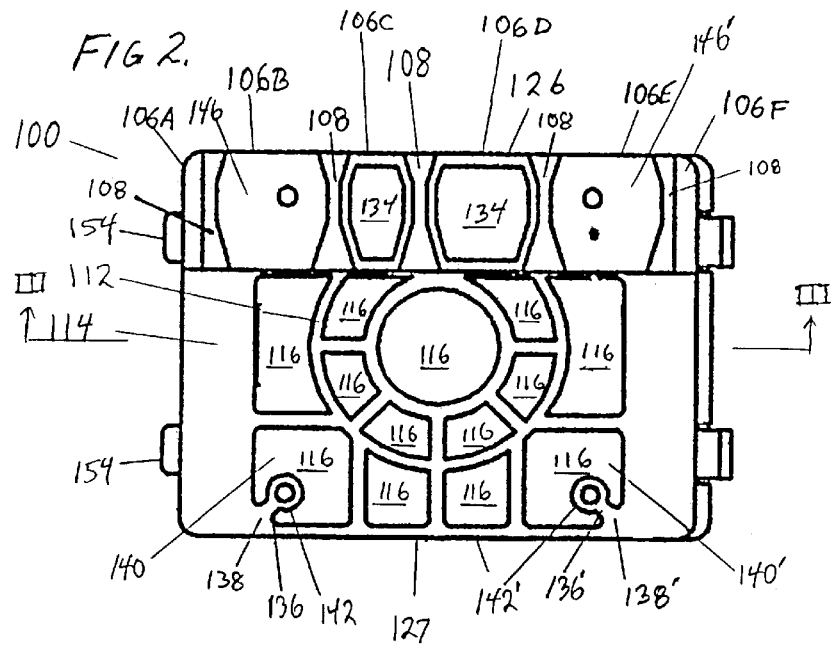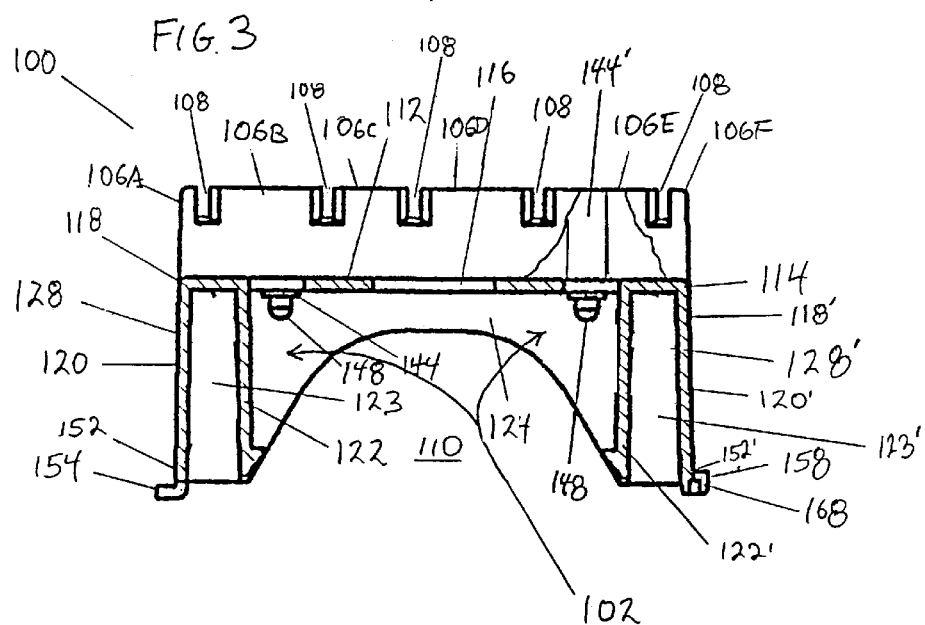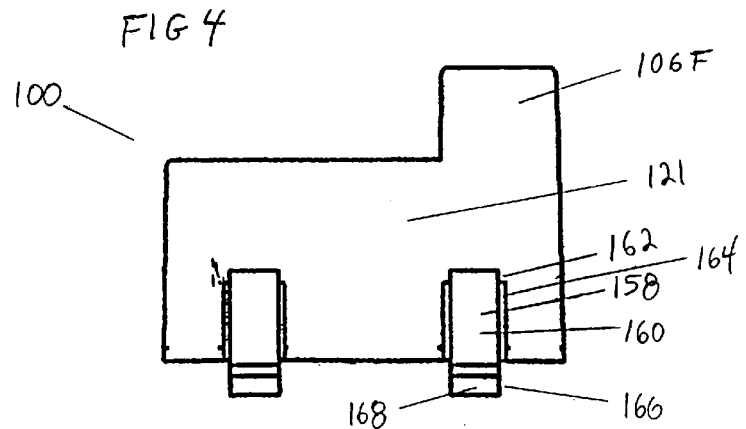

CARD SUPPORT AND COOLER BRACKET

CROSS REFERENCE TO RELATED APPLICATION

This application is a continuation of U.S. patent application Ser. No. 09/371,135, filed Aug. 10, 1999, now abandoned.

FIELD OF THE INVENTION

The present invention relates generally to computers and, more particularly, to a daughter card support and fan cooler for use within a computer housing.

BACKGROUND OF THE INVENTION

Personal computers are widely used in modern society. Personal computers generally consist of a cabinet containing a single chip-based system processor, and associated volatile and non-volatile memory. Also contained within the cabinet may be one or more diskette drives, and fixed disc storage. Peripheral equipment attached to the computer include a display monitor, a keyboard, a printer, etc. Typically, mounted within the cabinet of the computer is a planar, printed circuit motherboard that is used to electrically connect the various components of the computer together.

In addition, a large number and variety of printed circuit add-on daughter cards have been developed for providing enhanced operation and additional features for personal computers. Many add-on cards have become standardized in their dimensions and connectors and are suitable for plug-in attachment to the motherboard of a personal computer. Often, the motherboard connectors to which the daughter cards connect are mounted directly on the top surface of the motherboard so that the planar daughter cards plug into the motherboard perpendicular to the plane of the motherboard. This configuration allows the motherboard configuration to be more compact, thereby shortening the circuit path in the apparatus and allowing the system to operate at greater speed.

A number of auxiliary structures and techniques have been developed for permitting industry standard add on cards to be plugged into the motherboards. Some of these auxiliary structures have resulted in bulky and space consuming housings. In addition, extrinsic securing devices such as screws and bolts are often used to secure the daughter card within the housing. These mounting systems are cumbersome to use and require time and effort to assemble and disassemble.

The cabinet of a personal computer protects the operating components of the computer and shields against undesirable emission of electro-magnetic energy. There are many heat generating components enclosed in the cabinet of a computer. Unfortunately, most of the very large scale integrated circuits (VLSI chips) used in personal computers are designed to operate over certain temperature ranges. Consequently, it is necessary to provide for cooling of the components of the personal computer to assure proper operation.

Convection is used to cool the components of personal computers. Convection cooling often includes a forced air flow through the computer enclosure. Typically, a single fan is mounted adjacent to the power supply for the computer, producing a flow of air through the enclosure and particularly through the power supply, which is often the principle heat source within the enclosure. As discussed above, however, personal computers are routinely upgraded with add-on cards for various functions. Moreover, disk drives and VLSI chips may be upgraded. With such additions and upgrades, however, comes increased thermal load. This increased thermal load may overwhelm the existing cooling system of the personal computer.

Some personal computers have no provision for the addition of increased cooling in the computer cabinet. Others have space for a second cooling fan, but this often requires a complicated bracket that must be attached to the chassis of the computer with fasteners. Often there is no provision for producing cooling air directly to the added or upgraded components or conversely, cumbersome add-on ducts are needed.

What is required, then, is an easily employed bracket that supports add-on daughter cards and simultaneously provides the additional cooling required for these daughter cards.

SUMMARY OF THE INVENTION

The present invention provides a method and apparatus for supporting and cooling daughter cards of computers. In accordance with the present invention a bracket is provided which is detachably mounted in a computer. The bracket has a body and defines supports for a plurality of daughter cards. These supports may consist of slots. A cooling fan is attached to the body and its cooling air is directed over any daughter cards held by the slots. The fan may be detachably mounted to the body of the bracket with snap fittings. Similarly, the bracket may be detachably mounted to a chassis of a computer with snap fittings. The slots of the bracket align With electrical connectors of the motherboard of the computer in order to enable a secure electrical and mechanical connection of daughter cards to the computer.

In another aspect of the invention the supporting and cooling bracket consists of a platform defining a grill supported by end walls and side walls. The bracket defines a support for a daughter card and has a cooling fan detachably mounted to it and directed towards the daughter cards. Cooling air is collected by the plenum of the bracket.

In another aspect of the invention, an upgrade kit for a computer consists of an add-on daughter card and a bracket that defines a support for the daughter card and to which a cooling fan is attached.

The above and other advantages and features of the invention will be more readily understood from the following detailed description of the invention which is provided in connection with the accompanying drawings.

BRIEF DESCRIPTION OF THE DRAWINGS

FIG. 2 is an elevation view of a daughter card support and cooler bracket.

FIG. 3 is a sectional plan view of the nominal front of a daughter card support and cooler bracket.

FIG. 4 is a plan view of the nominal right side of a daughter card support and cooler bracket.

DETAILED DESCRIPTION OF THE INVENTION

Figure 1:
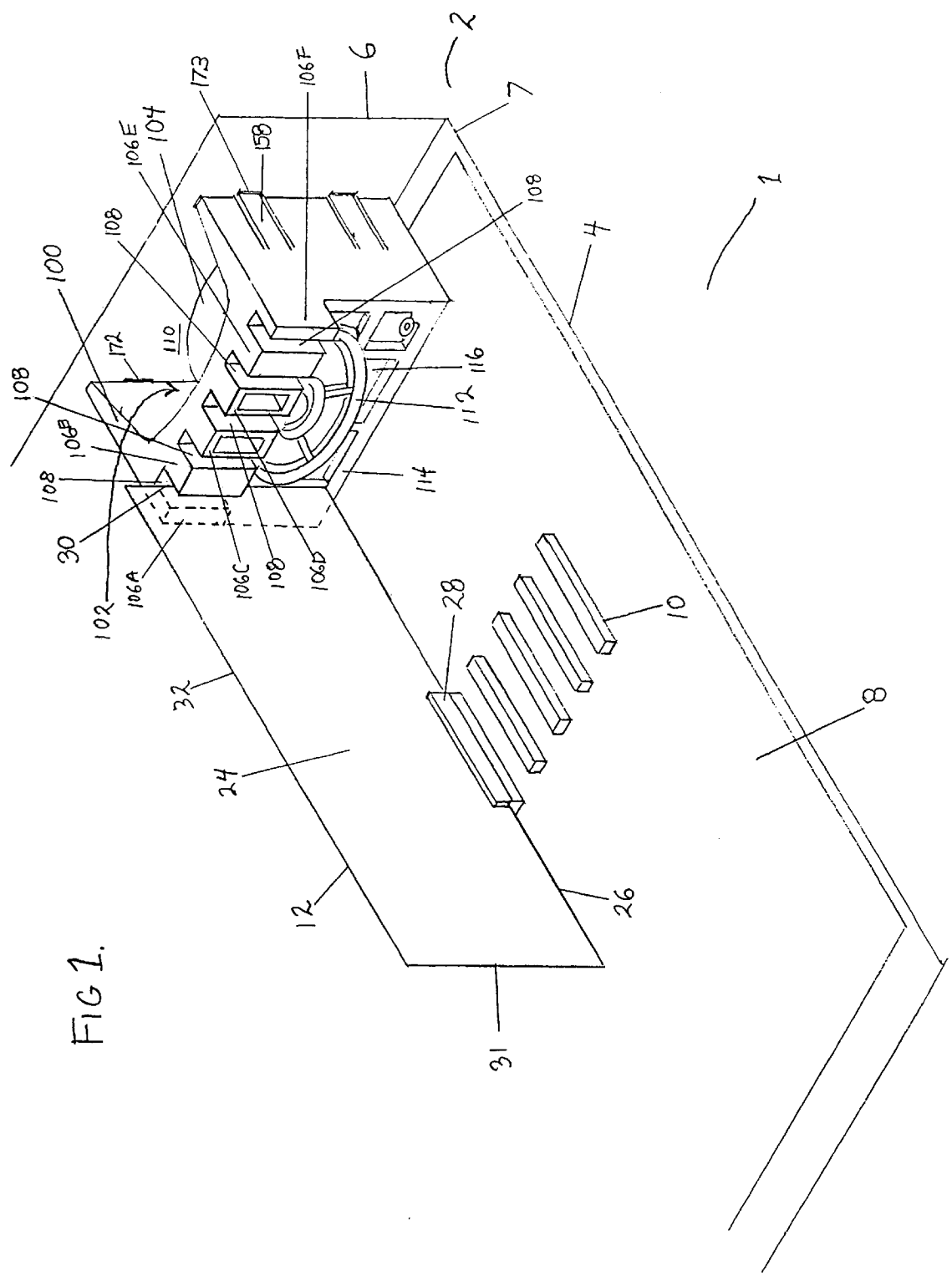
FIG. 1 is an illustration showing a perspective view of a daughter card support and cooler bracket within a computer housing.

A preferred embodiment of the invention is illustrated in FIG. 1. A computer 1 has a chassis 2 including a rectangular planar base 4 and a rectangular end wall 6 perpendicularly attached to one end 7 of the base 4. The computer also includes a housing, at least one microprocessor chip, a main memory, input/output systems and the like as would be apparent to those skilled in the art. The specific electrical and mechanical details of the computer system and its components are well known in the art and will not be further described. Mounted to the base 4, in a manner well known in the art, is a motherboard 8. A number of linear multi-pin connectors are mounted to the motherboard parallel to each other in such a fashion that a line drawn through the major dimension of each multi-pin connector is perpendicular to end wall 6.

The multi-pin connectors 10 are provided on the motherboard 8 for the purpose of adding various add-on daughter cards 12, one of which is shown in FIG. 1. These multi-pin connectors are electrically connected to the motherboard in order to provide access by the add-on daughter cards to the power, control signals and data lines of the main bus of the computer in a manner well known in the art. A card support and cooler bracket 100 is attached to the end wall 6. Mounted within a plenum 102 of the bracket 100 is a cooling fan 104. Protruding from the bracket 100 are a number of card-mounting lugs 106A–106F that define between them a number of card-mounting slots 108. The card-mounting lugs 106 are arranged in such a manner that the card-mounting slots 108 are in line with a plane that runs through the major dimension of the multi-pin connectors 10 and is perpendicular to both the base 4 and end wall 6.

The industry standard daughter card 12 consists of a rectangular printed circuit board 24 to which the various components required to perform the function of the daughter card are mounted. Along one edge 26 of the daughter card 24 is attached a multi pin edge connector 28 that is electrically connected to the components of the daughter card 12. Thus, the daughter card 12 may be mounted to the motherboard 8 by placing it in the plane through the appropriate multi-pin connector 10 and perpendicular to the base 4 and end wall 6 of the computer, sliding a second edge 30 of the daughter card 12 in the appropriate card-mounting slot 108 and connecting the multipin edge connector 28 of the daughter card 12 to the appropriate multi-pin connector 10 of the motherboard 8. This arrangement provides both a reliable electrical and mechanical connection of the daughter card 12 to the motherboard 8 and within the computer 1 itself. Those skilled in the art will appreciate that the invention can also be employed with full size and half size as well as nonstandard daughter cards, as well as with any planar computer components which may be mounted on a motherboard 8.

The cooling fan 104 is electrically connected to the computer 1, through an electrical snap connector or other means well known in the art, in such a manner that the fan 104 operates when the computer 1 is turned on. In operation the fan 104 collects air from the plenum 102 of the bracket 100. The air is drawn from outside the computer through vents and grills in the cabinet of the computer, for example in end wall 6, as is well known in the art. Some air is drawn through two large vents 110 of the bracket 100. The fan expels the cooling air through the grill 112 of the bracket along both surfaces of each daughter card 12 mounted to the bracket 100. The forced air efficiently cools the daughter cards 12 and provides additional general cooling to the computer 1 once it has passed the daughter cards 12. Depending on the computer applications involved, provision can be made for multiple card support and cooler brackets as required for mounting and cooling the add-on daughter cards 12 expected to be used. For instance, a second bracket could be mounted on end wall 6 next to bracket 100, and another set of daughter cards could be mounted parallel to daughter card 12 shown in FIG. 1. Bracket 100, fan 104, and/or daughter cards 12 also can be packaged together and supplied as upgrade kits for application to computers by original equipment manufacturers, computer remanufacturers, computer tradesmen, and end users.

Depending on the computer applications involved, provision can be made for multiple card support and cooler brackets as required for mounting and cooling the add-on daughter cards 12 expected to be used. For instance, a second bracket could be mounted on end wall 6 next to bracket 100, and another set of daughter cards could be mounted parallel to daughter card 12 shown in FIG. 1. Bracket 100, fan 104, and/or daughter cards 12 also can be packaged together and supplied as upgrade kits for application to computers by original equipment manufacturers, computer remanufacturers, computer tradesmen, and end users.

Bracket 100 is illustrated in more detail in FIG. 2 and 3. Bracket 100 can be attached within a computer in different orientations, thus the illustration of FIG. 3 shall be referred to as a plan view and the illustration of FIG. 2 shall be referred to as a front elevation view for convenience only. As best shown in FIG. 2, a planar, rectangular platform 114 has a plurality of cut-outs 116 arranged in a manner that the platform creates a lattice-like grill 112. At each end 118, 118' of the platform 114 are located planar, rectangular end walls 120, 120', best shown in FIG. 3, that are located flush with the ends 118, 118' of the platform 114 and perpendicular to the plane of the platform 114. Inner walls 122, 122' are located parallel to the end walls 120, 120' near the ends 118, 118' of the platform 114 leaving small spaces 123, 123' between the end walls 120, 120' and the inner walls 122, 122'. Two planar side walls 124, 124' (124' not shown in section view of FIG. 3) are located flush with the edges 126, 127 of the platform 114, each side wall 124 being joined with one end of each of the end walls 120, 120' and each of the inner walls 122, 122'. The entire bracket is preferably molded, extruded or otherwise formed as a single integral unit from low cost, durable polymers known in the art.

A large, substantially semi-circular vent 110 is formed in each side wall 124 between the inner end walls 122, 122' and opposite the platform 114. A plenum 102 is formed by the platform 114, inner walls 122, 122' and side walls 124, 124'. The side walls 124, 124', end walls 120, 120' and inner walls 122, 122' form two box-like supports 128, 128', one each at ends 118, 118' of the platform 114. Along first edge 126 and at each end 118, 118' of the platform 114 opposite the supports 128, 128' are two end lugs 106A, 106F in the form of narrow box like protrusions. In between the two end lugs 106A, 106F are central inner lugs 106C, 106D and distal inner lugs 106B, 106E. A series of five slots 108 are formed by lugs 106A–106F. The two central inner lugs 106C, 106D each have a cut-out 134 in them accessing the plenum 102. The lugs of the invention may be evenly spaced and rectilinear as shown in FIG. 1. Alternatively, they may be unevenly spaced to accommodate various motherboard or daughter card configurations and/or may have chamfered corners to facilitate daughter card insertion in slots 108, as shown in FIG. 2.

Tabs 136, 136' project from the outside corners 138, 138' of each corner cut-out 140, 140' of the platform 114. Each tab 136, 136' has a first cylindrical member 142, 142' oriented perpendicular to the platform 114. Within the two distal inner lugs 106B, 106E, second cylindrical members 144, 144' depend from closed surfaces 146, 146'. Each second cylindrical member 144, 144' is also perpendicular to the platform. Each of the first cylindrical members 142, 142' and second cylindrical members 144, 144' has a bayonet snap fitting 148.

At the foot 152 of end wall 120 are located two register posts 154 in the shape of an L. At the foot 152' of end wall 120' are molded two resilient, deflectable, rectangular snap fittings 158 consisting of a rectangular tab 160 attached at one end 162 of a slot 164 formed in the wall 120, as shown in FIG. 4. A projection 166 of the tab 160 protrudes past the surface of end wall 120' and has a shoulder 168. Alternatively, two additional snap fittings like snap fittings 158 can be located on end wall 120 instead of register posts 154 for engaging the chassis 2. Accordingly, in one embodiment of the invention shown in FIG. 3, the end walls 120 and 120' of the bracket 100 connect to end wall 6 of the chassis (FIG. 1) with the register posts 154 and rectangular snap fittings 158. The inner walls 122 and 122' are disposed inwardly from the end walls 120 and 120' and define the plenum 102. The fan 104 is positioned within the plenum 102 and is secured in place by the barbed ends of the inner walls 122 and 122'. The barbed ends of the inner walls 122 and 122' also provide an offset between the chassis end wall 6 and the end of the fan closest to the chassis end wall 6. The generally semi-circular vents 110 in opposite sidewalls 124 of the bracket 100 allow air to be drawn into the plenum 102 and through the fan 104 via the gap between the fan 104 and the chassis end wall 6.

An advantage of His arrangement is that the vents 110 allow the fan to draw air from within the chassis into the plenum 102, mix the air drawn through the vents 110 with air drawn directly into the plenum 102 through grills in the computer chassis, and propel the air over the daughter cards for cooling.

In operation, a standard, 60 mm cooling fan 104, having four recesses opposite bayonet snap fittings 148, is easily snapped into the plenum 102 of the bracket 100. Those skilled in the art will be familiar with this and other types of snap-together arrangements, as well as other fasteners for this task such as screws and the like. The bracket 100 is then easily assembled onto the end wall 6 of the chassis 2. Two sets of two slots 172, 173 are located in end wall 6 and spaced to engage the register posts 154 and the snap fit projections 166 of bracket 100. Assembly is accomplished by placing the L shaped register posts 154 in slots 172 and rotating the bracket 100 about the register posts 154 until the snap fit projections 166 snap into the second set of slots 173. Assembly is completed by snapping together the electrical connector of the fan to the computer.

Daughter cards 12 are inserted by engaging a second edge 30 of the daughter card 12 in a slot 108 of the bracket 100 and connecting the multi-pin edge connector 28 of the daughter card 12 into the multi-pin connector 10 of the motherboard 8. The combination of the connectors 10, 28 and the slot 108 provides a reliable, electrical connection and stable physical support of the daughter card 12, and easy assembly and disassembly. During operation of the computer 1, the fan 104 operates to draw air from the plenum 102 and force it between and around the daughter cards 12 to cool them. From there the air dissipates throughout the cabinet of the computer 1 for additional cooling of the computer 1.

The invention provides a method and apparatus for simply and inexpensively adding support and cooling for add-on daughter cards used in computers.

Variations of the embodiment will be readily apparent to those skilled in the art. For example, the invention may be employed with the bracket mounted to the base 4 of the chassis 2, instead of the end wall 6. Accordingly, it is to be understood that although the present invention has been described with reference to a preferred embodiment, various modifications may be made to the structures and steps presented herein by those skilled in the art without departing from the spirit or scope of the invention which is defined in the claims appended hereto.

What is claimed as new and desired to be protected by Letters Patent of the United States is:

1. A fan bracket for a computer, comprising:
    a bracket body connectable to a computer chassis;
    at least one support on the body for supporting add-on daughter cards for the computer, the support arranged such that a daughter card engageable with the support is also engageable with an electrical connector located on a motherboard of the computer;
    at least one fan connector on the body for mounting a cooling fan; and
    a plenum for gathering cooling air.

2. The bracket of claim 1, wherein the fan connector is arranged on the body such that a cooling fan mounted thereto will direct air toward any daughter cards supported by the at least one support.

3. The bracket of claim 1, wherein said body further comprises a grill through which cooling air is directed.

4. The bracket of claim 1, wherein said supports are slots provided on said bracket body.

5. The bracket of claim 1, wherein the at least one fan connector for mounting a cooling fan is a snap connector.

6. The bracket of claim 1, further comprising at least one daughter card which is supported by said bracket by engaging with said supports.

7. The bracket of claim 1, wherein said body, supports, and connectors are formed as an integral assembly.

8. The bracket of claim 7, wherein said integral assembly is a one-piece molded assembly.

9. The bracket of claim 3, further comprising a planar platform including openings defining said grill, said cooling fan by mounting to said grill.

10. The bracket of claim 1, wherein said bracket body further comprises a snap connector and an L-shaped member for connecting said body to a chassis of the computer.

11. The bracket of claim 10, wherein said bracket body further comprises a first support member including said L-shaped member and a second support member including said snap connector.

12. The bracket of claim 11, wherein said L-shaped member is engageable with a first slot in said chassis and said snap connector is engageable with a second slot in said chassis.

13. The bracket of claim 1, wherein the bracket body further comprises snap connectors for connecting the body to a chassis of the computer, the bracket body having sidewalls defining vents to the plenum.

14. A cooling assembly which may be detachably mounted to a computer, the assembly comprising:
    a bracket body connectable to a computer chassis and having sidewalls defining vents to a plenum;
    supports on the bracket body for supporting add-on daughter cards for the computer, at least one of the supports being arranged such that a daughter card engageable with the support is also engageable with an electrical connector located on a motherboard of the computer;
    at least one fan connector on the body for mounting a cooling fan;

a cooling fan mounted to the at least one fan connector; and a grill through which cooling air is directed.

15. The cooling assembly of claim 14, wherein the at least one fan connector is arranged on the said body such that the cooling fan mounted thereto will direct air toward any of the daughter cards supported by the supports.

16. The cooling assembly of claim 14, further comprising a plenum for gathering cooling air.

17. The cooling assembly of claim 14, wherein the supports include slots provided on said bracket body.

18. The cooling assembly of claim 14, wherein the at least one fan connector for mounting a cooling fan is a snap connector.

19. The cooling assembly of claim 14, further comprising an L-shaped member for mounting the bracket body to the chassis.

20. The cooling assembly of claim 14, further comprising at least one daughter card which is supported by said bracket by engaging with said supports.

21. A cooling assembly for mounting an add-on daughter card to a computer, the cooling assembly comprising:

a bracket body, connectable to a chassis of the computer, defining supports for an add-on daughter card; and a fan connected to the bracket body, wherein the body and supports are formed as a one-piece, molded assembly.

22. The cooling assembly of claim 21, wherein said fan is connected to said body such that cooling air is directed over said daughter card supported by said supports.

23. The cooling assembly of claim 21, wherein said body further comprises a grill through which said cooling air is directed.

24. The cooling assembly of claim 21, wherein said body further comprises a plenum for gathering said cooling air.

25. The cooling assembly of claim 21, wherein the supports include slots provided on said bracket body.

26. The cooling assembly of claim 21, wherein the bracket body further comprises a snap connector for connecting said body to a chassis of a computer.

27. The cooling assembly of claim 26, further comprising an L-shaped member for connecting said body to said chassis.

28. The cooling assembly of claim 21, wherein said fan is mounted to said body with snap connectors.

29. The cooling assembly of claim 21, further comprising at least one daughter card which is supported by said bracket by engaging with said supports.

30. A bracket, for mounting a daughter card in a computer, the bracket comprising:

a platform defining a grill;

end walls and side walls attached to the platform and defining a plenum;

a support for a daughter card arranged such that a daughter card engageable with the support is also engageable with an electrical connector located on a motherboard of the computer;

a fan detachably engaged to the platform; and at least one snap connector attached to a first of the end walls which is engageable with a chassis of a computer;

wherein the side walls define vents to the plenum.

31. The bracket of claim 30, wherein said fan is engaged to said platform such that cooling air is collected in said plenum and directed across said daughter card.

32. The bracket of claim 30, wherein said support is a slot defined by two rectangular members projecting from said platform.

33. The bracket of claim 30, wherein said fan is a snap fit to said platform.

34. The bracket of claim 30, wherein the support is adapted and arranged to engage a daughter card at a first edge and a daughter card engaged with the support is positioned to engage with the electrical connector on a second edge adjacent to the first edge.

35. A computer, comprising:

a chassis having a base and an end wall;

a motherboard mounted to the base;

at least one daughter card;

a first electrical connector on the motherboard connectable to a second electrical connector on a first edge of the at least one daughter card; and a bracket for removably supporting the at least one daughter card within the housing, the bracket comprising:

connectors attaching the bracket to the chassis;

a support for a second edge of the daughter card;

a cooling fan for directing air toward the at least one daughter card; and a plenum for gathering the cooling air, the plenum having sidewalls defining vents to the plenum.

36. The computer of claim 35, wherein said bracket further comprises a grill through which cooling air from said cooling fan is directed.

37. The computer of claim 35, wherein the support includes a slot provided on the bracket body.

38. The computer of claims 35, wherein said connectors are snap connectors.

39. The computer of claim 38, wherein said snap connectors are engaged with slots in said chassis.

40. The computer of claim 35, wherein the connectors include at least one L-shaped member and at least one snap connector.

41. The computer of claim 40, wherein said at least one L-shaped member and said at least one snap connector are engaged with slots in said chassis.

42. The computer of claim 35, wherein the fan is detachably mounted to the bracket with a snap fitting.

43. The computer of claim 37, wherein said slot and said first electrical connector align.

44. A method of cooling a computer to accommodate heat-generating add-on daughter cards, comprising:

supporting at least one daughter card by supports on a bracket connectable to a chassis of the computer;

engaging the at least one daughter card with an electrical connector located on a motherboard of the computer;

directing cooling air over the said at least one daughter card by a fan detachably attached to the bracket; and gathering the cooling air with a plenum.

45. The method of claim 44, wherein said method further comprises directing said cooling air through a grill of said bracket.

* * * * *

UNITED STATES PATENT AND TRADEMARK OFFICE
CERTIFICATE OF CORRECTION

PATENT NO. : 6,330,156 B1  
DATED : December 11, 2001  
INVENTOR(S) : Cresse

Page 1 of 1

It is certified that error appears in the above-identified patent and that said Letters Patent is hereby corrected as shown below:

<u>Title page,</u>  
References Cited, U.S. Pat. No. 5,793,608, "Winnick" should be -- Winick --;

<u>Column 2,</u>  
Line 11, "producing" should be -- ducting --;  
Line 31, "With" should be -- with --;

<u>Column 4,</u>  
Line 25, "cut-outs" should be -- cutouts --;

<u>Column 5,</u>  
Line 28, "His" should be -- this --;

<u>Column 6,</u>  
Line 40, "by" should be -- being --;

Signed and Sealed this

Twenty-eighth Day of May, 2002

*Attest:*

*Attesting Officer*

JAMES E. ROGAN  
*Director of the United States Patent and Trademark Office*